(12) United States Patent
Imabayashi

(10) Patent No.: US 12,538,641 B2
(45) Date of Patent: Jan. 27, 2026

(54) DISPLAY DEVICE MANUFACTURING METHOD AND DISPLAY DEVICE

(71) Applicant: SHARP KABUSHIKI KAISHA, Sakai (JP)

(72) Inventor: Hiroki Imabayashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 388 days.

(21) Appl. No.: 18/026,104

(22) PCT Filed: Sep. 16, 2020

(86) PCT No.: PCT/JP2020/035091
§ 371 (c)(1),
(2) Date: Mar. 13, 2023

(87) PCT Pub. No.: WO2022/059094
PCT Pub. Date: Mar. 24, 2022

(65) Prior Publication Data
US 2023/0337513 A1    Oct. 19, 2023

(51) Int. Cl.
*H10K 50/17*    (2023.01)
*H10K 50/115*   (2023.01)
*H10K 59/00*    (2023.01)
*H10K 59/12*    (2023.01)
*H10K 71/30*    (2023.01)
*H10K 71/60*    (2023.01)

(52) U.S. Cl.
CPC ......... *H10K 50/17* (2023.02); *H10K 59/1201* (2023.02); *H10K 59/771* (2023.02); *H10K 71/30* (2023.02); *H10K 71/60* (2023.02); *H10K 50/115* (2023.02)

(58) Field of Classification Search
CPC .. H10K 50/115; H10K 50/17; H10K 59/1201; H10K 59/771; H10K 71/30
See application file for complete search history.

(56) References Cited

U.S. PATENT DOCUMENTS

2016/0155785 A1    6/2016    Sato
2018/0108841 A1*   4/2018    Li ................. H10K 71/421

FOREIGN PATENT DOCUMENTS

| JP | 2001076880 A  |   | 3/2001 |
|----|---------------|---|--------|
| JP | 2016103395 A  |   | 6/2016 |
| JP | 2018101761 A  | * | 6/2018 |
| WO | 2020021722 A1 |   | 1/2020 |

\* cited by examiner

*Primary Examiner* — Daniel P Shook
(74) *Attorney, Agent, or Firm* — ScienBiziP, P.C.

(57) ABSTRACT

A display device manufacturing method of manufacturing a display device including a plurality of light-emitting elements in each of which an anode, a hole injection layer, a light-emitting layer, and a cathode are layered in this order, the hole injection layer being provided in common in the plurality of light-emitting elements, and the method including treating the hole injection layer with a treatment liquid to change conductivity of at least a portion of the hole injection layer.

9 Claims, 5 Drawing Sheets

DISPLAY DEVICE MANUFACTURING METHOD AND DISPLAY DEVICE

TECHNICAL FIELD

The disclosure relates to a display device manufacturing method and a display device.

BACKGROUND ART

For example, PTL 1 discloses a display device in which a dividing area where a hole transport layer and a hole injection layer are not formed is provided between pixels.

CITATION LIST

Patent Literature

PTL 1: JP 2016-103395 A

SUMMARY

Technical Problem

In the display device disclosed in PTL 1, for example, it takes time to form the dividing area, and thus the manufacture thereof is complicated.

A main object of the disclosure is to provide a display device manufacturing method that facilitates manufacture, and a display device.

Solution to Problem

A display device manufacturing method according to an aspect of the disclosure is a display device manufacturing method of manufacturing a display device including a plurality of light-emitting elements in each of which an anode, a hole injection layer, a light-emitting layer, and a cathode are layered in this order, the hole injection layer being provided in common in the plurality of light-emitting elements, and the method including treating the hole injection layer with a treatment liquid to change electrical conductivity of at least a portion of the hole injection layer.

A display device according to another one aspect of the disclosure includes a plurality of light-emitting elements in each of which an anode, a hole injection layer, a light-emitting layer, and a cathode are layered in this order, in which the hole injection layer is common to the plurality of light-emitting elements and includes a first portion corresponding to a light-emitting region in each of the plurality of light-emitting elements and a second portion having electrical conductivity different from electrical conductivity of the first portion.

DESCRIPTION OF EMBODIMENTS

Embodiments to be described below are merely illustrative of the disclosure. The disclosure is not limited to the following embodiments.

First Embodiment

Figure 1:
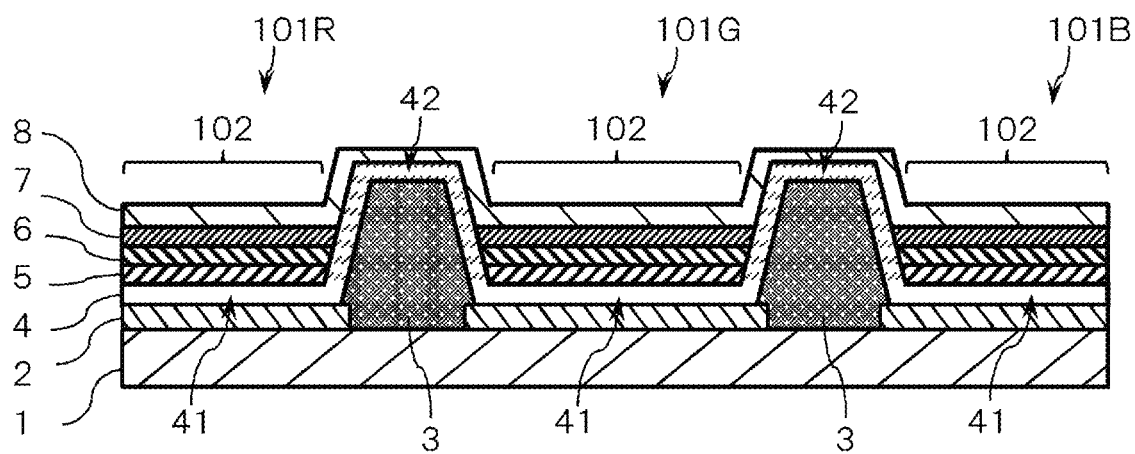
FIG. 1 is a diagram schematically illustrating an example of a layered structure of a display device according to a first embodiment.

FIG. 1 is a diagram schematically illustrating an example of a layered structure of a display device 100 according to the present embodiment.

As illustrated in FIG. 1, the display device 100 includes, for example, a plurality of light-emitting elements 101R, 101G, and 101B in each of which an anode 2, a hole injection layer 4, a hole transport layer 5, a light-emitting layer 6, an electron transport layer 7, and a cathode 8 are layered in this order on a substrate 1. The light-emitting element 101R emits red light. The light-emitting element 101G emits green light. The light-emitting element 101B emits blue light. For example, the light-emitting elements 101R, 101G, and 101B (hereinafter, may be collectively referred to as "light-emitting elements 101") that emit light of three colors constitute one pixel as one set. The display device 100 is configured such that, for example, a plurality of pixels are disposed in a matrix shape.

The light-emitting elements 101 are provided on the substrate 1, are divided by banks 3, and have light-emitting regions 102 that emit light. The light-emitting region 102 is, for example, a region in which at least the light-emitting layer 6 is layered between the anode 2 and the cathode 8 when seen in a plan view.

The substrate 1 is constituted by, for example, a glass substrate, a flexible substrate including a resin film such as polyimide, and functions as a support body that supports the above-described layers. The substrate 1 may be, for example, an array substrate in which a thin film transistor (TFT) and the like are formed.

The anode 2 supplies holes to the light-emitting layer 6.

The cathode 8 supplies electrons to the light-emitting layer 6. Further, the cathode 8 is provided to face the anode 2.

Any one of the anode 2 and the cathode 8 is formed of a light-transmissive material. Note that any one of the anode 2 and the cathode 8 may be formed of a light-reflective material. In a case where the light-emitting element 101 is configured as a top emission light-emitting element, for example, the cathode 8 being an upper layer is formed of a light-transmissive material, and the anode 2 being a lower layer is formed of a light-reflective material. Further, in a case where the light-emitting element 101 is configured as a bottom emission light-emitting element, for example, the cathode 8 being an upper layer is formed of a light-reflective material, and the anode 2 being a lower layer is formed of a light-transmissive material. In addition, either one of the anode 2 or the cathode 8 may be configured as a layered body including a light-transmissive material and a light-reflective material to form an electrode having light reflectivity.

As the light-transmissive material, a transparent conductive material can be used, for example Specifically, examples of the light-transmissive material to be used may include indium tin oxide (ITO), indium zinc oxide (IZO), tin oxide ($SnO_2$), or fluorine-doped tin oxide (FTO). These materials have a high transmittance of visible light, and thus luminous efficiency of the light-emitting element 101 is enhanced.

As the light-reflective material, a metal material can be used, for example. Specifically, examples of the light-reflective material to be used may include aluminum (Al), silver (Ag), copper (Cu), and gold (Au). These materials have a great reflectivity of visible light, and thus luminous efficiency is enhanced.

Note that the anode 2 and the cathode 8 can be formed by various known methods in the related art such as a sputtering method and a vacuum vapor deposition technique, for example. For example, when the anode 2 is formed of ITO, the anode 2 can be formed by a sputtering method. For example, when the cathode 8 is formed of Al, the cathode 8 can be formed by a vacuum vapor deposition technique.

The light-emitting layer 6 is disposed between the anode 2 and the cathode 8 and emits light. The light-emitting layer 6 includes a light-emitting material such as an organic light-emitting material or quantum dots. For example, the light-emitting layer 6 emits light with a predetermined luminescent color by recombination of holes supplied from the anode 2 and electrons supplied from the cathode 8. The luminescent color of the light-emitting element 101 depends on the luminescent color of the light-emitting layer 6. That is, in the light-emitting layer 6, light-emitting materials having different luminescent colors are used corresponding to the light-emitting elements 101 of RGB. For example, the light-emitting layer 6 can be formed by an ink-jet method, an application method, a deposition method, or the like. Note that, in a case where the light-emitting material of the light-emitting layer 6 is formed of an organic light-emitting material, the light-emitting layer 6 becomes a so-called OLED, and in a case where the light-emitting material of the light-emitting layer 6 is formed of quantum dots, the light-emitting layer 6 becomes a so-called QLED.

The hole transport layer 5 is disposed between the anode 2 and the light-emitting layer 6 and transports holes from the anode 2 to the light-emitting layer 6. The hole transport layer 5 includes a hole transport material.

The hole transport material can be appropriately selected from materials that are generally used in this field, and examples thereof include an organic hole transport material and an inorganic hole transport material.

Examples of the organic hole transport materials include materials such as 4,4',4''-tris(9-carbazoyl)triphenylamine (TCTA), 4,4'-bis[N-(1-naphthyl)-N-phenyl-amino]-biphenyl (NPB), zinc phthalocyanine (ZnPC), di[4-(N,N-ditolylamino)phenyl]cyclohexane (TAPC), 4,4'-bis(carbazol-9-yl) biphenyl (CBP), 2,3,6,7,10,11-hexacyano-1,4,5,8,9,12-hexaazatriphenylene (HATCN), and $MoO_3$, poly(N-vinylcarbazole) (PVK), poly(2,7-(9,9-di-n-octylfluorene)-(1,4-phenylene-((4-sec-butylphenyl)imino)-1,4-phenylene (TFB), N4,N4'-bis(4-6-((3-ethyloxetan-3-yl)methoxy) hexyl)phenyl)-N4,N4'-diphenylbiphenyl-4,4'-diamine (OTPD), poly[N,N'-bis(4-butylphenyl)-N,N'-bis(phenyl) benzidine] (poly-TPD), and polyaniline.

Examples of the inorganic hole transport material include a material including one or more selected from the group consisting of nitrides, and carbides, and oxides such as metal oxides including any one or more of Zn, Cr, Ni, Ti, Nb, Al, Si, Mg, Ta, Hf, Zr, Y, La, and Sr.

The thickness of the hole transport layer 5 is preferably equal to or more than 15 nm and equal to or less than 80 nm. In a case where the thickness of the hole transport layer 5 is less than 15 nm, there is a possibility that the hole transport properties of the hole transport layer 5 will be impaired. Further, in a case where the thickness of the hole transport layer 5 exceeds 80 nm, there is a possibility that a drive voltage of the light-emitting element 101 will increase and a current will be miniaturized.

Note that the hole transport layer 5 can be formed by, for example, an application method such as a spin coating method or a dip coating method, a sol-gel method, a sputtering method, a vacuum vapor deposition technique, a CVD method, or the like depending on a material forming the hole transport layer 5.

The hole injection layer 4 is disposed between the anode 2 and the hole transport layer 5 and injects holes from the anode 2 into the hole transport layer 5. Note that it is preferable that the materials of the hole injection layer 4 and the hole transport layer 5 be different from each other.

Furthermore, the hole injection layer 4 includes, for example, a first portion 41 and a second portion 42 having electrical conductivity less than that of the first portion 41 as illustrated in FIG. 1. In other words, the electrical conductivity of the first portion 41 is different from that of the second portion. In the present embodiment, the electrical conductivity of the second portion 42 becomes less than that of the first portion 41 by being treated with a treatment liquid. In this manner, examples of the material of which the electrical conductivity is reduced by the treatment with the treatment liquid include PEDOT:PSS, an organic material including PEDOT:PSS as a main component. Note that examples of an organic material (additive) other than PEDOT:PSS include TCTA, a phthalocyanine-based material, or HATCN. Further, a solvent such as DMSO or ethylene glycol may be added to PEDOT:PSS.

The treatment liquid is appropriately selected depending on a material forming the hole injection layer 4. Examples of such a treatment liquid include an alkaline solution, and an acidic solution.

Examples of the alkaline solution include a sodium hypochlorite aqueous solution, a tetramethylammonium hydroxide aqueous solution, ammonia water, a sodium hydroxide aqueous solution, a potassium hydroxide aqueous solution, a sodium hydrogen carbonate aqueous solution, and a potassium hydrogen carbonate aqueous solution.

Examples of the acidic solution include organic acids such as carboxylic acids such as hydrochloric acid, nitric acid, sulfuric acid, hydrofluoric acid, phosphoric acid, acetic acid, and benzoic acid, and sulfonic acids such as benzenesulfonic acid. Note that the organic acids such as a carboxylic acid and a sulfonic acid may have acid properties and may have various functional groups.

Note that the volume conductivity of the first portion 41 is preferably 100 times or more the volume conductivity of the second portion. In addition, the volume conductivity of the second portion be preferably equal to or more than 0 [S/cm] and equal to or less than $1 \times 10^{-4}$ [S/cm].

The thickness of the hole injection layer 4 is preferably equal to or more than 15 nm and equal to or less than 100 nm. In a case where the thickness of the hole injection layer 4 is less than 15 nm, there is a possibility that the hole injection property of the hole injection layer 4 will be impaired. Further, in a case where the thickness of the hole injection layer 4 exceeds 100 nm, the uniformity of film thickness of the hole injection layer 4 may be impaired, and there is a possibility that the efficiency of hole injection into the hole transport layer 5 will decrease.

Note that the hole injection layer 4 can be formed by, for example, an application method such as a spin coating method or a dip coating method, a sol-gel method, a sputtering method, a vacuum vapor deposition technique, a CVD method, or the like, depending on a material forming the hole injection layer 4.

Further, in the light-emitting element 101 of the present embodiment, the hole transport layer 5 is not an essential configuration, and for example, the hole injection layer 4 and the light-emitting layer 6 may be configured to be in direct contact with each other without the hole transport layer 5. In this case, holes are transported from the hole injection layer 4 to the light-emitting layer 6.

The electron transport layer 7 is disposed between the cathode 8 and the light-emitting layer 6 and transports electrons from the cathode 8 to the light-emitting layer 6. The electron transport layer 7 includes an electron transport material.

The electron transport material can be appropriately selected from materials that are generally used in this field, and examples thereof include compounds and complexes including one or more nitrogen-including heterocycles such as oxadiazole ring, triazole ring, triazine ring, quinoline ring, phenanthroline ring, pyrimidine ring, pyridine ring, imidazole ring, and carbazole ring. Specific examples thereof include 1,10-phenanthroline derivatives such as bathocuproine and bathophenanthroline, benzimidazole derivatives such as 1,3,5-tris(N-phenylbenzimidazol-2-yl)benzene (TPBI), bis(10-benzoquinolinolato) beryllium complexes, 8-hydroxyquinoline Al complexes, metal complexes such as bis(2-methyl-8-quinolinate)-4-phenylphenolate aluminum, and 4,4'-biscarbazole biphenyls. Other examples thereof include aromatic boron compounds, aromatic silane compounds, aromatic phosphine compounds such as phenyldi(1-pyrenyl)phosphine, bathophenanthroline, bathocuproine, 2,2',2"-(1,3,5-benzenetriyl)-tris(1-phenyl-1-H-benzimidazole) (TPBI), nitrogen-including heterocyclic compounds such as triazine derivatives.

Note that the electron transport layer 7 can be formed by, for example, an application method such as a spin coating method or a dip coating method, a sol-gel method, a sputtering method, a CVD method, or the like depending on a material forming the electron transport layer 7.

Further, in the light-emitting element 101 of the present embodiment, the electron transport layer 7 is not an essential configuration, and for example, the cathode 8 and the light-emitting layer 6 may be configured to be in direct contact with each other without the electron transport layer 7.

Hereinafter, an example of a manufacturing method for the display device 100 in the present embodiment will be specifically described.

First, after the anode 2 having an island shape is formed on the substrate 1, the banks 3 are formed to divide the island-shaped anodes 2.

Figure 2A:
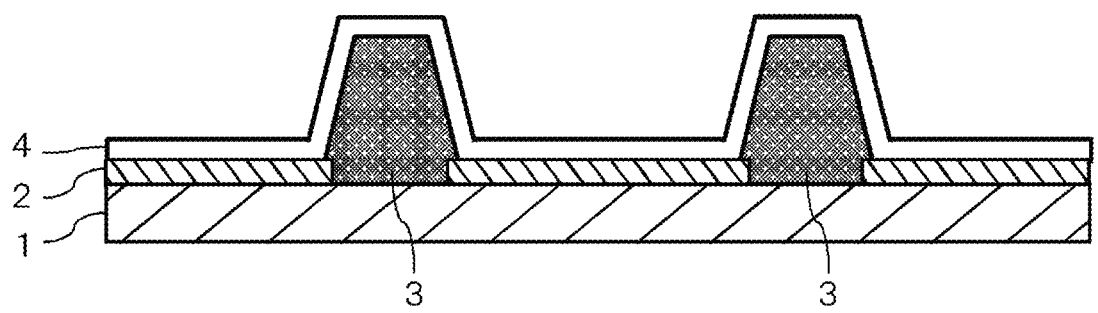
FIG. 2A is a diagram schematically illustrating a portion of a manufacturing process for the display device illustrated in FIG. 1.

Next, as illustrated in FIG. 2A, the hole injection layer 4 is formed on the formed anode 2 and banks 3. The hole injection layer 4 is formed of a material of which the electrical conductivity changes by a treatment liquid to be described later. In the present embodiment, a material of which the electrical conductivity decreases by a treatment liquid is used.

Here, in the present embodiment, an example in which the electrical conductivity of the second portion in the hole injection layer 4 decreases by the above treatment liquid.

Figure 2B:
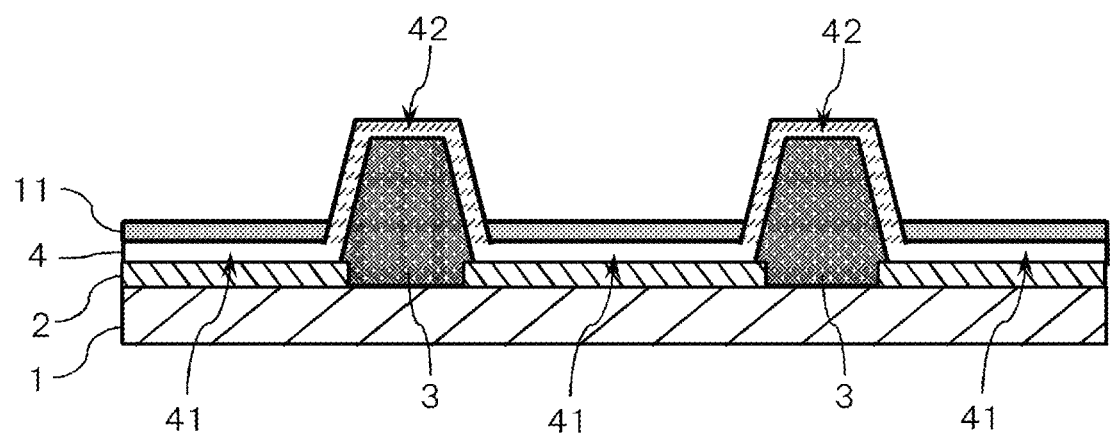
FIG. 2B is a diagram schematically illustrating a portion of a manufacturing process for the display device illustrated in FIG. 1.

As illustrated in FIG. 2B, a resist layer 11 is formed on the hole injection layer 4 in a region overlapping the light-emitting region 102. The region overlapping the light-emitting region 102 corresponds to the first portion 41 of the hole injection layer 4. The resist layer 11 can be formed, for example, by forming the resist layer 11 on the entire surface of the hole injection layer 4, performing exposure so that the resist layer 11 remains on the first region 41 of the hole injection layer 4 overlapping the light-emitting region, and then performing development with a developer. Thereby, the first portion 41 can be covered with the resist layer 11. For example, a novolac resin is used for the resist layer 11.

Next, the portion (second portion 42) of the hole injection layer 4 which is exposed by the resist layer 11 is treated with a treatment liquid. This treatment reduces the electrical conductivity of the second portion 42.

The hole injection layer 4 is formed of, for example, PEDOT:PSS. As the treatment liquid, for example, an alkaline solution such as a sodium hypochlorite aqueous solution is used.

Further, in a case where the developer can be used as the treatment liquid, treatment with the treatment liquid can be performed at the same time in the development, and thus a manufacturing process can be simplified.

After the treatment with the treatment liquid, the resist layer 11 is peeled off.

Then, the hole transport layer 5, the light-emitting layer 6, the electron transport layer 7, and the cathode 8 are sequentially layered on the hole injection layer 4. Thereby, the display device 100 illustrated in FIG. 1 can be manufactured.

According to the manufacturing method for the display device 100 of the present embodiment, the display device 100 can be manufactured by a simple process of treating the hole injection layer 4 with a treatment liquid.

In addition, according to the display device 100 of the present embodiment, by making the electrical conductivity of the second portion 42 less than the electrical conductivity of the first portion 41, current leakage between the adjacent light-emitting elements 101 can be suppressed. This makes it possible to suppress an increase in power consumption in the display device 100, and luminescent colors between the adjacent light-emitting elements 101, for example, between the light-emitting elements 101R and 101G, between the light-emitting elements 101G and 101B, and between the light-emitting elements 101R and 101B, and to suppress a decrease in display performance in the display device 100.

Second Embodiment

Differences from the first embodiment will be described in the present embodiment. Note that, for convenience of description, components having the same function as the components described in the first embodiment are designated by the same reference numbers, and descriptions thereof are omitted.

Figure 3:
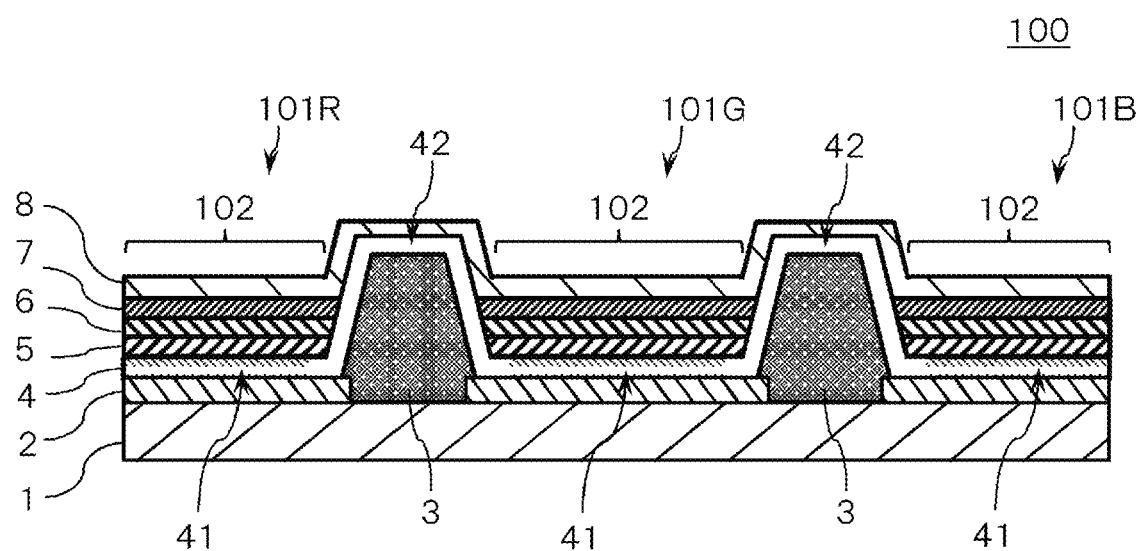
FIG. 3 is a diagram schematically illustrating an example of a layered structure of a display device according to a second embodiment.

For example, as illustrated in FIG. 3, a display device 100 of the present embodiment is different from that in the first embodiment in that a first portion 41 of a hole injection layer 4 is treated with a treatment liquid to increase the electrical conductivity.

A manufacturing method for the display device 100 according to the present embodiment is the same as that according to the first embodiment until the hole injection layer 4 is formed as illustrated in FIG. 2A. However, in the present embodiment, the hole injection layer 4 is formed of a material of which the electrical conductivity is increased by a treatment liquid. Examples of the material of which the electrical conductivity is increased by a treatment liquid include polyaniline, an organic material including polyaniline as a main component. Note that examples of an organic material (additive) other than polyaniline include TCTA, a phthalocyanine-based material, or HATCN.

Figure 4:
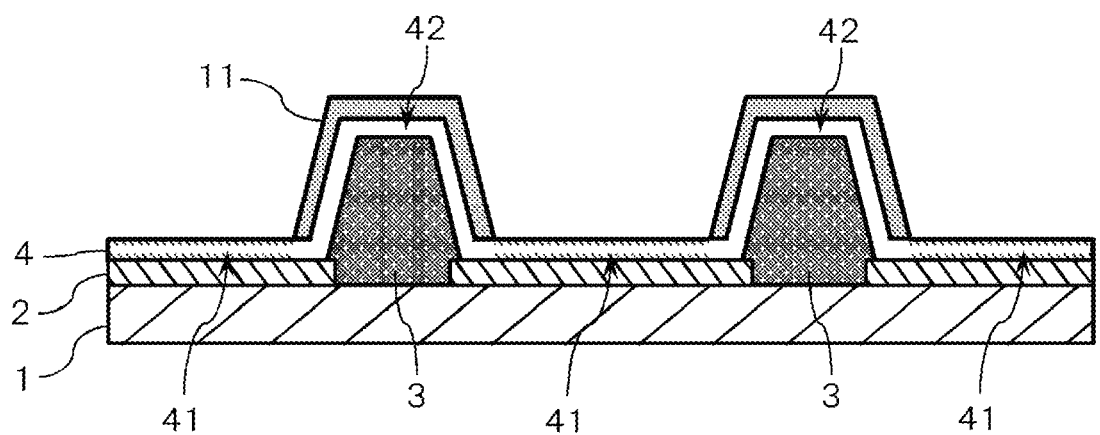
FIG. 4 is a diagram schematically illustrating a portion of a manufacturing process for the display device illustrated in FIG. 3.

Next, after the hole injection layer 4 is formed, a resist layer 11 is formed to cover a second portion 42 on the hole injection layer 4 as illustrated in FIG. 4. The resist layer 11 can be formed in the same manner as in the first embodiment. That is, as in the first embodiment, for example, a novolac resin is used for the resist layer 11.

Next, a portion (first portion 41) of the hole injection layer 4 which is exposed by the resist layer 11 is treated with a treatment liquid. This treatment increases the electrical conductivity of the first portion 41.

The hole injection layer 4 is formed of, for example, polyaniline. In addition, as the treatment liquid of polyaniline, for example, acidic solutions such as hydrochloric acid, nitric acid, sulfuric acid, hydrofluoric acid, phosphoric acid, carboxylic acids such as acetic acid and benzoic acid, and sulfonic acids such as benzenesulfonic acid can be used.

Note that the volume conductivity of the first portion 41 is preferably 100 times or more the volume conductivity of the second portion. In addition, the volume conductivity of the second portion is preferably equal to or more than 0 [S/cm] and equal to or less than $1 \times 10^{-4}$ [S/cm].

Further, in a case where the developer can be used as the treatment liquid, treatment with the treatment liquid can be performed at the same time in the development, and thus a manufacturing process can be simplified.

After the treatment with the treatment liquid, the resist layer 11 is peeled off.

Then, a hole transport layer 5, a light-emitting layer 6, an electron transport layer 7, and a cathode 8 are sequentially layered on the hole injection layer 4. Thereby, the display device 100 illustrated in FIG. 3 can be manufactured.

According to the manufacturing method for the display device 100 of the present embodiment, the display device 100 can be manufactured by a simple process of treating the hole injection layer 4 with a treatment liquid.

In addition, according to the display device 100 of the present embodiment, by making the electrical conductivity of the first portion 41 greater than the electrical conductivity of the second portion 42, current leakage between the adjacent light-emitting elements 101 can be suppressed. This makes it possible to suppress an increase in power consumption in the display device 100, and to suppress color mixing of luminescent colors between the adjacent light-emitting elements 101, and to suppress a decrease in display performance in the display device 100.

The disclosure is not limited to the embodiments described above, and may be substituted with a configuration that is substantially the same as the configuration described in the embodiments described above, a configuration that achieves the same operational effects, or a configuration capable of achieving the same object.

The invention claimed is:

1. A display device manufacturing method of manufacturing a display device including a plurality of light-emitting elements in each of which an anode, a hole injection layer, a light-emitting layer, and a cathode are layered in this order, the hole injection layer being provided in common in the plurality of light-emitting elements, the display device manufacturing method comprising:
    treating the hole injection layer with a treatment liquid to change electrical conductivity of at least a portion of the hole injection layer,
    wherein the hole injection layer includes at least one selected from Poly(3,4-ethylenedioxythiophene) polystyrene sulfonate (PEDOT:PSS) and an organic material including the PEDOT:PSS as a main component, and
    the treatment liquid is an alkaline solution.

2. The display device manufacturing method according to claim 1,
    wherein a second portion of the hole injection layer, other than a first portion corresponding to a light-emitting region of at least one of the plurality of light-emitting elements, is treated with the treatment liquid.

3. The display device manufacturing method according to claim 2,
    wherein the first portion is covered with a resist layer, and the second portion, which is not covered by the resist layer, is then treated with the treatment liquid to reduce electrical conductivity of the second portion.

4. The display device manufacturing method according to claim 1,
    wherein the alkaline solution is selected from at least one of a sodium hypochlorite aqueous solution, a tetramethylammonium hydroxide aqueous solution, ammonia water, a sodium hydroxide aqueous solution, a potassium hydroxide aqueous solution, a sodium hydrogen carbonate aqueous solution, and a potassium hydrogen carbonate aqueous solution.

5. The display device manufacturing method according to claim 1,
    wherein the light-emitting layer includes quantum dots.

6. A display device manufacturing method of manufacturing a display device including a plurality of light-emitting elements in each of which an anode, a hole injection layer, a light-emitting layer, and a cathode are layered in this order, the hole injection layer being provided in common in the plurality of light-emitting elements, the display device manufacturing method comprising:
    treating the hole injection layer with a treatment liquid to change electrical conductivity of at least a portion of the hole injection layer,
    wherein a first portion of the hole injection layer corresponding to a light-emitting region of at least one of the plurality of light-emitting elements is treated with the treatment liquid.

7. The display device manufacturing method according to claim 6,
    wherein a second portion of the hole injection layer, other than the first portion, is covered with a resist layer, and the first portion, which is not covered by the resist layer, is then treated with the treatment liquid to increase electrical conductivity of the first portion.

8. The display device manufacturing method according to claim 7,
    wherein the hole injection layer includes a material selected from at least one polyaniline and an organic material, including polyaniline, as a main component, and
    the treatment liquid is an acidic solution.

9. The display device manufacturing method according to claim 8,
    wherein the acidic solution is selected from at least one of a hydrochloric acid, a nitric acid, a sulfuric acid, a hydrofluoric acid, a phosphoric acid, a carboxylic acid, and a sulfonic acid.

* * * * *